(12) United States Patent
Nishimoto

(10) Patent No.: US 11,601,162 B2
(45) Date of Patent: Mar. 7, 2023

(54) CAPACITIVE COUPLING CIRCUIT DEVICE PROVIDED WITH CAPACITIVE COUPLING CIRCUIT DEMODULATING MODULATED SIGNAL TRANSMITTED THROUGH COUPLING CAPACITOR

(71) Applicant: Panasonic Intellectual Property Management Co., Ltd., Osaka (JP)

(72) Inventor: Taiki Nishimoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 13 days.

(21) Appl. No.: 17/439,754

(22) PCT Filed: Feb. 5, 2020

(86) PCT No.: PCT/JP2020/004407
§ 371 (c)(1),
(2) Date: Sep. 15, 2021

(87) PCT Pub. No.: WO2020/189068
PCT Pub. Date: Sep. 24, 2020

(65) Prior Publication Data
US 2022/0190876 A1 Jun. 16, 2022

(30) Foreign Application Priority Data
Mar. 18, 2019 (JP) .............................. JP2019-049718

(51) Int. Cl.
*H04M 1/00* (2006.01)
*H04B 5/00* (2006.01)
(Continued)

(52) U.S. Cl.
CPC ............. *H04B 5/0012* (2013.01); *H04B 1/12* (2013.01); *H04L 25/0266* (2013.01)

(58) Field of Classification Search
CPC .......... H04B 1/12; H04B 1/10; H04B 1/0458; H04B 5/0012; H04L 25/0266
See application file for complete search history.

(56) References Cited

U.S. PATENT DOCUMENTS 5,870,046 A 2/1999 Scott et al.
9,071,208 B2 * 6/2015 Nagahisa ................ H03F 3/387
(Continued)

FOREIGN PATENT DOCUMENTS

JP 2002-509667 A 3/2002

OTHER PUBLICATIONS

International Search Report issued in International Patent Application No. PCT/JP2020/004407, dated Apr. 7, 2020; with English translation.
(Continued)

*Primary Examiner* — Nhan T Le
(74) *Attorney, Agent, or Firm* — McDermott Will & Emery LLP

(57) ABSTRACT

A capacitive coupling circuit device is provided with a capacitive coupling circuit and a ground-side feedback circuit. The capacitive coupling circuit demodulates a modulated signal, which is obtained by modulating an input signal and transmitting a modulated input signal through a coupling capacitor. The ground-side feedback circuit is inserted between a first ground terminal on a signal input side of the capacitive coupling circuit and a second ground terminal on a signal output side of the capacitive coupling circuit. The ground-side feedback circuit is configured by connecting a second capacitor in series to a parallel circuit of a first capacitor and a first resistor. Alternatively, the ground-side feedback circuit may be configured by connecting the sec-
(Continued)

ond capacitor and a third capacitor in series to both ends of the parallel circuit of the first capacitor and the first resistor, respectively.

8 Claims, 11 Drawing Sheets

(51) Int. Cl.
*H04B 1/12* (2006.01)
*H04L 25/02* (2006.01)

(56) References Cited

U.S. PATENT DOCUMENTS

| | | | |
|---|---|---|---|
| 9,713,922 B2* | 7/2017 | Sano | B41J 2/14233 |
| 9,948,146 B2* | 4/2018 | Kanno | H04B 1/0458 |
| 2019/0068410 A1 | 2/2019 | Al-Shyoukh et al. | |

OTHER PUBLICATIONS

English translation of International Preliminary Report on Patentability issued in International Application No. PCT/JP2020/004407, dated Sep. 30, 2021.

* cited by examiner

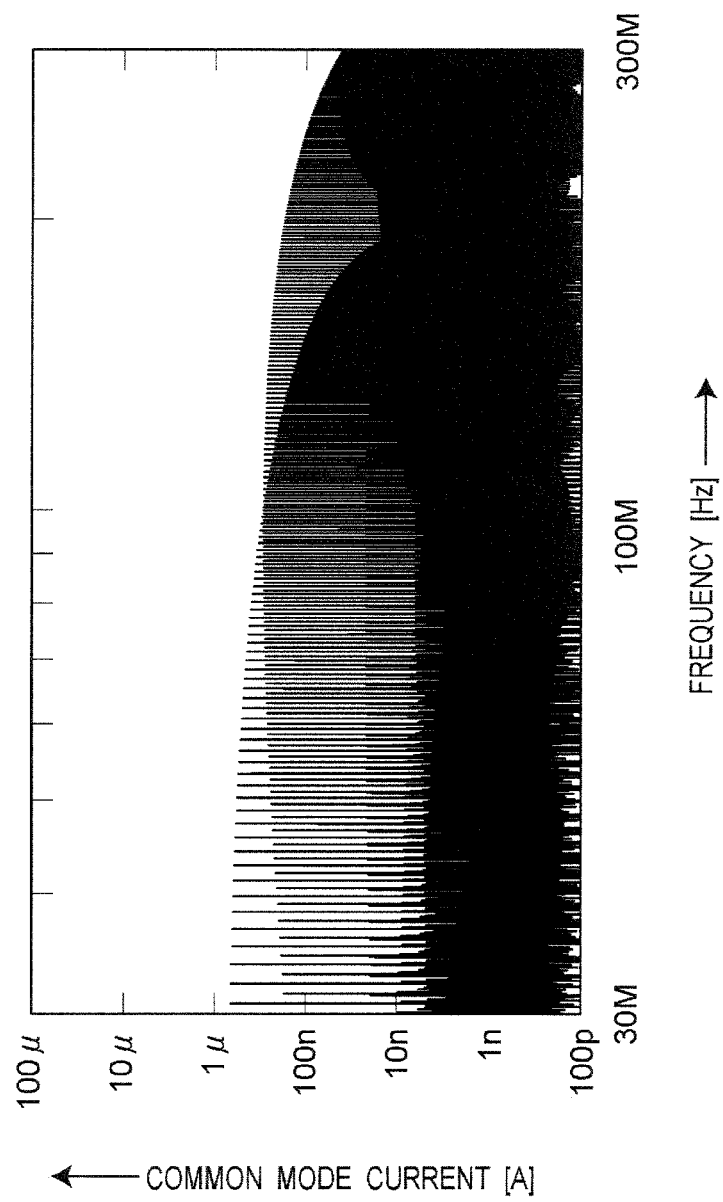

CAPACITIVE COUPLING CIRCUIT DEVICE PROVIDED WITH CAPACITIVE COUPLING CIRCUIT DEMODULATING MODULATED SIGNAL TRANSMITTED THROUGH COUPLING CAPACITOR

CROSS-REFERENCE OF RELATED APPLICATIONS

This application is the U.S. National Phase under 35 U.S.C. § 371 of International Patent Application No. PCT/JP2020/004407, filed on Feb. 5, 2020, which in turn claims the benefit of Japanese Application No. 2019-049718, filed on Mar. 18, 2019, the entire disclosures of which Applications are incorporated by reference herein.

TECHNICAL FIELD

The present disclosure relates to a capacitive coupling circuit device.

BACKGROUND ART

In the power supply systems of electric vehicles, in-vehicle equipment that uses high voltage, industrial equipment, medical equipment, etc., it is necessary to design the circuits of low voltage and high voltage to be electrically separated (isolated) for safety reasons. However, even in such equipment, it is essential to send and receive signals between low-voltage and high-voltage circuits. For example, a high-voltage switching power supply circuit operates by receiving control signals from an IC mounted in a low-voltage circuit, and a high-voltage battery sends information on the voltage and temperature of the battery cells to an IC mounted in a low-voltage circuit, and the IC feeds back the received information to the operation of the power supply system.

In such devices, isolators are used to send and receive signals between isolated low-voltage and high-voltage circuits. In general, the isolators are classified into three types according to the coupling method between the signal input side and the signal output side: optical coupling type, inductive coupling type, and capacitive coupling type. In capacitive coupling isolators, the signal input side and the signal output side are coupled by a capacitor. The capacitor insulates the DC component and transmits the high-frequency component, so that the signal transmission from the signal input side to the signal output side is realized by signal modulation using the high-frequency component.

However, since the modulated signal transmitted from the signal input side through the capacitor is demodulated at the signal output side and a new digital signal is regenerated, this becomes a noise voltage source and can cause conducted noise and radiated noise. As a countermeasure, a certain noise suppression effect can be obtained by connecting the ground of the signal input side and the ground of the signal output side with a capacitor.

Patent Document 1 discloses a circuit configuration of a conventional example in which the ground on the signal input side and the ground on the signal output side are connected by a capacitor in an isolator circuit of the capacitive coupling method. In Patent Document 1, it is stated that the capacitor acts as a return path for the modulated signal, and this leads to improvement in the signal integrity (SI). At the same time, the ground potential on the signal output side is stabilized, which is expected to have some noise suppression effect.

PRIOR ART DOCUMENT

Patent Document

Patent Document 1: U.S. Pat. No. 5,870,046A.

SUMMARY OF THE INVENTION

Problem to be Solved by the Invention

However, since the noise suppression effect of the above measures is limited, a noise filter using capacitors, resistors, and inductors is required to further suppress the noise. This not only increases the mounting area and cost of the components, but also causes delays and distortions in the signal due to the addition of components on the signal line, which may interfere with normal signal transmission and reception.

The purpose of the present disclosure is to provide a capacitive coupling circuit device that can reduce conducted or radiated noise caused by an isolator without adding noise suppression components on the signal line in a capacitive coupling circuit device using a capacitive coupling circuit such as an isolator.

Means to Solve the Problems

According to one aspect of the present disclosure, there is provided a capacitive coupling circuit device including a capacitive coupling circuit and a ground-side feedback circuit. The capacitive coupling circuit demodulates a modulated signal, which is obtained by modulating an input signal and transmitting a modulated input signal through a coupling capacitor. The ground-side feedback circuit is inserted between a ground terminal on a signal input side and a ground terminal on a signal output side of the capacitive coupling circuit. The ground-side feedback circuit is configured by connecting a second capacitor in series to a parallel circuit of a first capacitor and a first resistor.

Effect of the Invention

According to a capacitive coupling circuit device according to one aspect of the present disclosure, conducted noise and radiated noise can be reduced, as compared to the conventional configuration in which a capacitor is used to connect the ground on the signal input side to the ground on the signal output side. This reduces the number of noise-reducing components to be inserted on the signal line, reduces the component mounting area and cost, and improves the signal quality.

BRIEF DESCRIPTION OF THE DRAWINGS

FIG. 8B shows results of the circuit simulation of FIG. 7B, showing a graph of frequency characteristics of the common mode current.

BEST MODE FOR IMPLEMENT THE INVENTION

Embodiments of the present disclosure are described below with reference to the drawings. The same signs are attached to the same or similar components.

Embodiment 1

Figure 1:
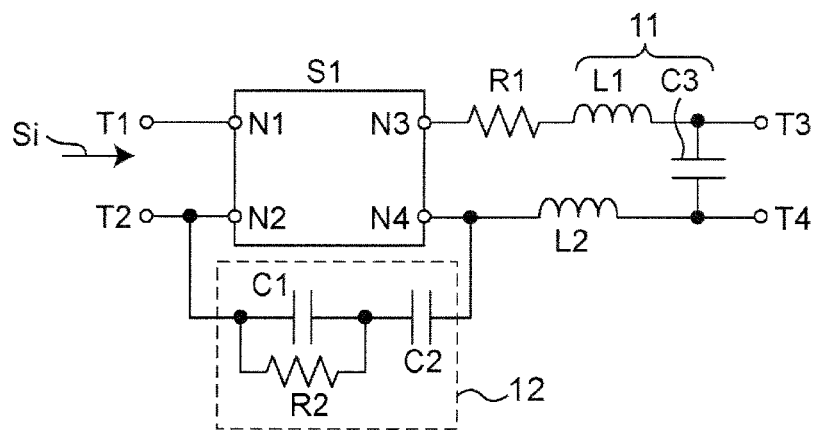
FIG. 1 is a circuit diagram showing a configuration example of a capacitive coupling circuit device according to Embodiment 1.

FIG. 1 is a circuit diagram showing a configuration example of a capacitive coupling circuit device according to Embodiment 1.

Referring to FIG. 1, the capacitive coupling circuit device includes external terminals T1 to T4, a capacitive coupling circuit S1, a resistor R1, capacitors C1 to C3, and inductors L1 and L2. In this case, the capacitive coupling circuit S1 includes at least one coupling capacitor C4 in its internal circuit (see FIG. 2), and has connection terminals N1 to N4. The capacitive coupling circuit device operates, for example, as a communication circuit that outputs the input signal Si inputted between the external terminals T1 and T2 as an output signal between the external terminals T3 and T4. In this case, the external terminals T1 to T4 are provided for the following purposes:

(1) T1: Signal input external terminal;
(2) T2: Ground external terminal on the signal input side;
(3) T3: Signal output external terminal; and
(4) T4: Ground external terminal on the signal output side.

Referring to FIG. 1, the resistor R1 is an output resistor of the capacitive coupling circuit S1, and the inductor L1 and capacitor C3 configures an L-type low-pass filter (LPF) 11 on the signal output side. This is an example of a low-pass filter, which may be configured to be modified as described below. In addition, a ground-side feedback circuit 12 is connected between the connection terminals N4 and N2 of the capacitive coupling circuit S1. The ground-side feedback circuit 12 is configured by connecting a capacitor C2 in series to a parallel circuit of a resistor R2 and a capacitor C1. It is noted that, for example, L2 is a parasitic inductor of signal wiring.

Figure 2:
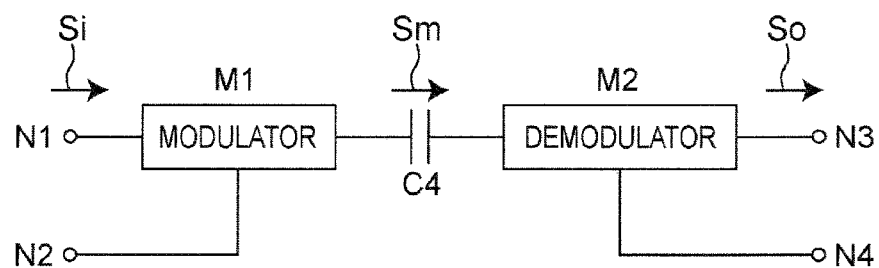
FIG. 2 is a circuit diagram showing a configuration example of a capacitive coupling circuit S1 of FIG. 1.

FIG. 2 shows a configuration example of the capacitive coupling circuit S1 of FIG. 1. The capacitive coupling circuit S1 includes a modulator M1, a demodulator M2, a coupling capacitor C4, and connection terminals N1 to N4. In this case, the connection terminals N1 to N4 are provided for the following purposes:

(1) N1: Signal input terminal;
(2) N2: Ground terminal on the signal input side;
(3) N3: Signal output terminal; and
(4) N4: Ground terminal on the signal output side.

The modulator M1 modulates an input signal Si, which is a binary digital signal inputted to the connection pin N1, by switching the input signal Si, for example, by using the ON/OFF modulation method, and outputs a modulated signal Sm to the demodulator M2 through the coupling capacitor C4. The demodulator M2 demodulates the received modulated signal Sm into the output signal So, which is a binary digital, by the aforementioned ON/OFF modulation method and outputs it from the connection terminal N3. The modulation method of the modulator M1 is not limited to the aforementioned ON/OFF modulation method, but may be other modulation methods such as ASK modulation, as long as the output signal Si can be modulated into a signal having higher frequency components.

The capacitive coupling circuit S1 configured as described above, for example, configures an isolator circuit of capacitive coupling type.

Figure 3:
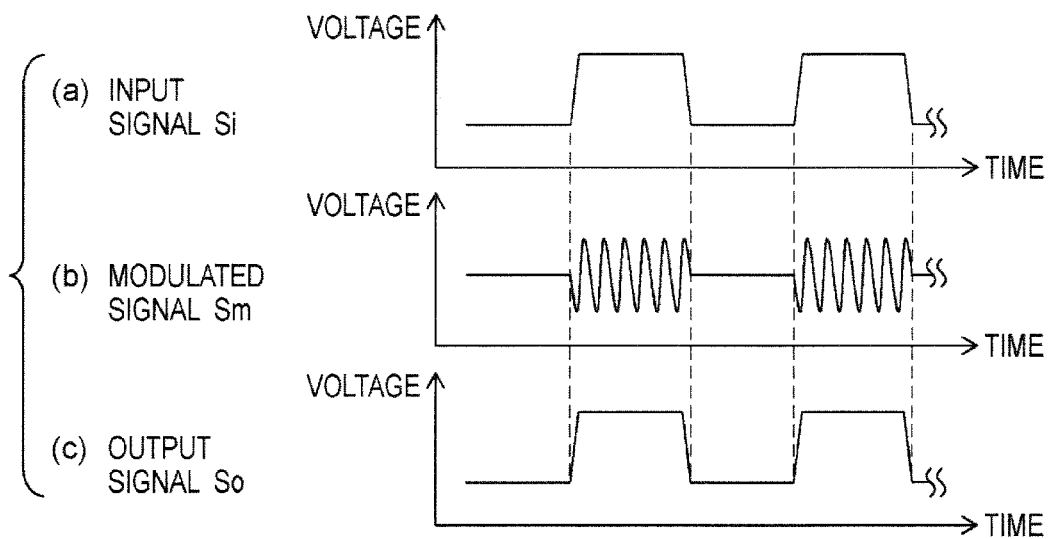
FIG. 3 is a schematic waveform diagram showing signal waveforms in the case of ON/OFF modulation method used in Embodiment 1.

FIG. 3 is a schematic waveform diagram showing signal waveforms in the case of ON/OFF modulation method used in Embodiment 1.

When the input signal Si of FIG. 3(a) is inputted between the connection terminals N1 and N2 of FIG. 2, the modulated signal Sm of FIG. 3(b) is outputted to the coupling capacitor C4 by the modulator M1. The modulated signal Sm is demodulated by the demodulator M2, and an output signal So of FIG. 3(c) is outputted between the connection terminals N3 and N4. Since the modulated signal Sm contains high frequency components, it can be transmitted through the coupling capacitor C4.

Figure 4:
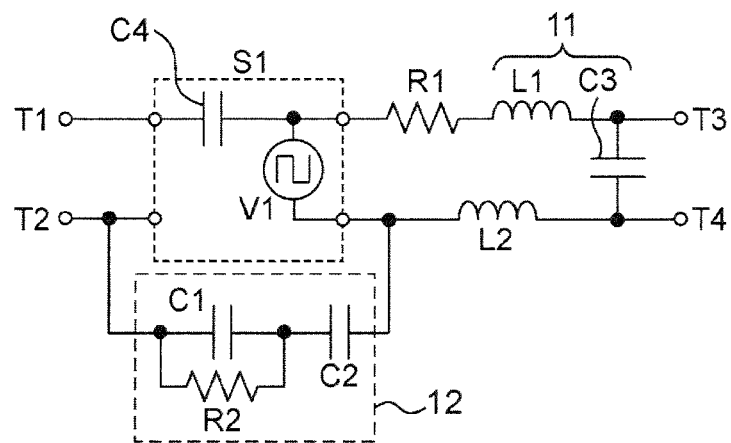
FIG. 4 is a circuit diagram showing an operation of the capacitive coupling circuit device of FIG. 1.

FIG. 4 shows a circuit diagram showing an operation of the capacitive coupling circuit device of FIG. 1 when the capacitive coupling circuit S1 is represented by FIG. 2. In general, in an isolator circuit of the capacitive coupling type, the capacitor that couples the signal input side to the signal output side has a capacitance of pF order. In other words, the impedance of the capacitor is set to be much larger than, for example, 1, and the impedance between the connection terminals N1 and N3 of FIG. 1 is represented mainly by the coupling capacitor C4, as shown in FIG. 4. In the isolator circuit of capacitive coupling type, the digital signal generated by the demodulator M2 becomes the noise voltage source, and this noise voltage source is represented by V1.

Figure 5:
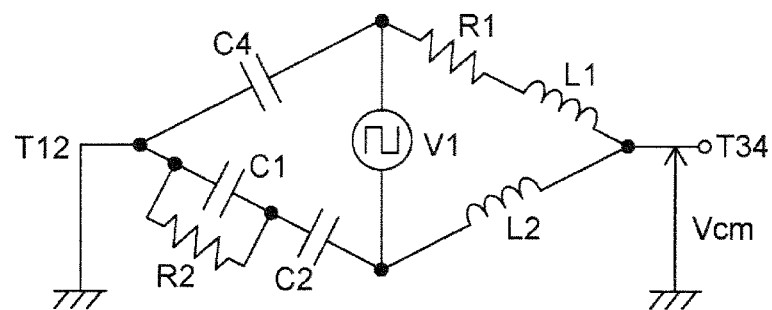
FIG. 5 is a circuit diagram showing a common mode equivalent circuit of the circuit diagram of FIG. 4.

FIG. 5 is a circuit diagram showing a common mode equivalent circuit corresponding to the circuit diagram of FIG. 4. Since it is a common-mode equivalent circuit, the external terminals T1 and T2 on the signal input side are collectively represented by T12, and the external terminals T3 and T4 on the signal output side are collectively represented by T34. In this case, the ground symbol is attached to the signal input side as a reference ground for the entire capacitive coupling circuit device. It is noted that the capacitor C2 is connected in series to the parallel circuit, since the electrical isolation between the signal input side and the signal output side is impaired when the ground side feedback circuit 12 is only a parallel circuit of resistor R2 and capacitor C1.

Figure 6:
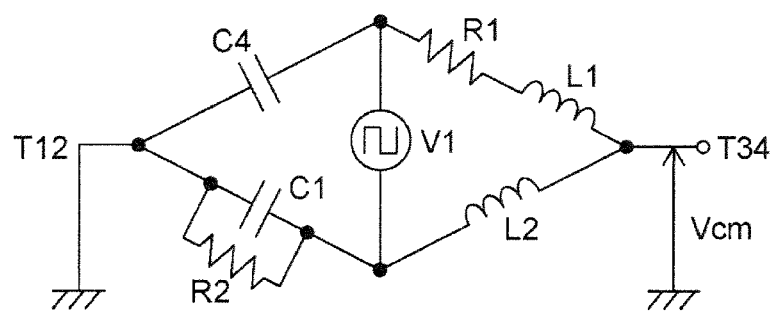
FIG. 6 is a circuit diagram of FIG. 4 showing an equivalent circuit of FIG. 5 in the case of C1<<C2.

FIG. 6 shows an equivalent circuit of FIG. 5 when the capacitance value of capacitor C2 is designed to be sufficiently larger than that of capacitor C1 (namely, in the case of C1<<C2). In the following, the signs are used as the numerical values of each of the resistors R1 and R2, each of the inductors L1 and L2, and each of the capacitors C1 to C4.

In FIG. 6, Vcm is a common mode electrical potential at the external terminal T34 on the signal output side. When a voltage is transmitted from the noise voltage source V1 to the common mode electrical potential Vcm, the common mode noise propagates from the external terminal T34 to the outside of the capacitive coupling circuit device. The voltage transfer coefficient from the noise voltage source V1 to the common mode electrical potential Vcm is expressed by the following equation (1):

$$\frac{Vcm}{V1} = \frac{j\omega L2}{R1 + j\omega L1 + j\omega L2} - \frac{\frac{R2}{1+j\omega C1 R2}}{\frac{1}{j\omega C4} + \frac{R2}{1+j\omega C1 R2}}. \quad (1)$$

From the above equation (1), the conditions under which the voltage transfer coefficient becomes zero is calculated, and the following equations are obtained:

$$L2 = R1R2C4 \quad (2), \text{ and}$$

$$C4L1 = C1L2 \quad (3).$$

In other words, by using the capacitive coupling circuit device of FIG. 1, the common mode noise propagating to the outside of the capacitive coupling circuit device can be reduced. In particular, when the designing is done such that L2=R1 R2 C4 and C4 L1=C1 L2, the common mode noise can be significantly reduced.

Figure 7A:
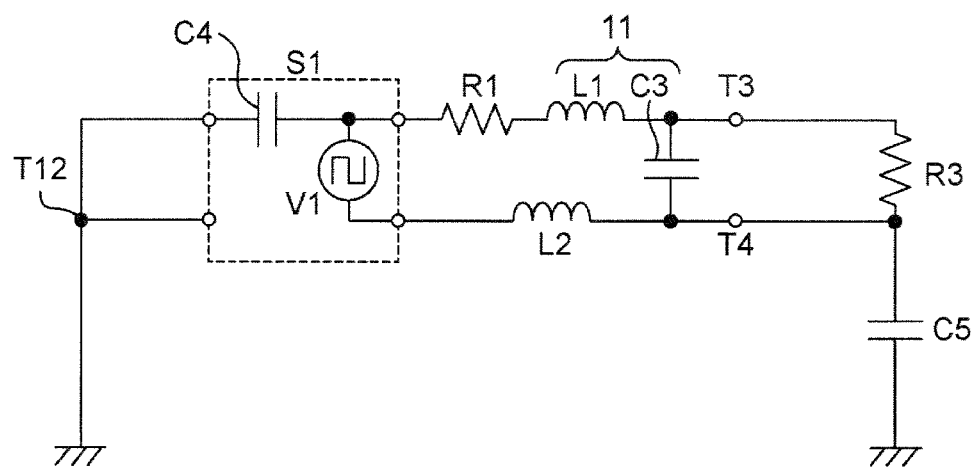
FIG. 7A is a circuit diagram of FIGS. 4 and 5 showing a circuit used in a circuit simulation, without noise suppression.
Figure 7B:
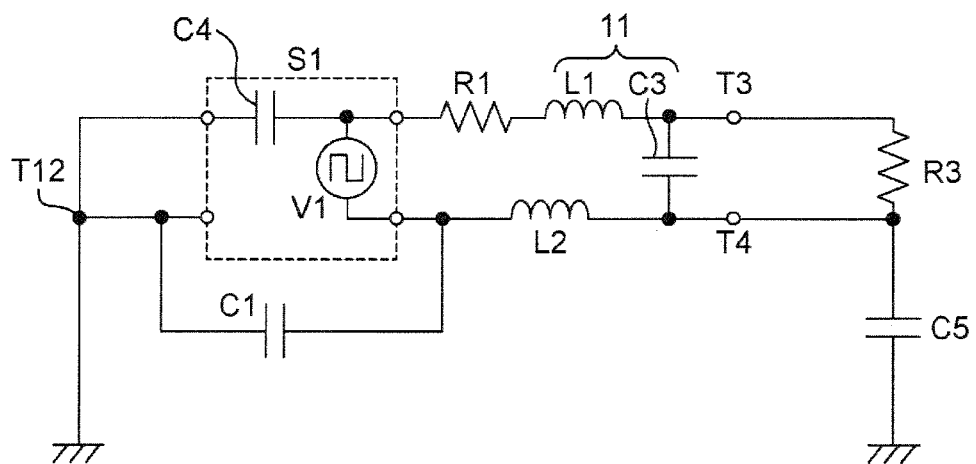
FIG. 7B is a circuit diagram shown in FIGS. 4 and 5 showing a circuit used in a circuit simulation, when a ground on a signal input side and a ground on a signal output side are connected by a capacitor C1, as in the conventional case.
Figure 7C:
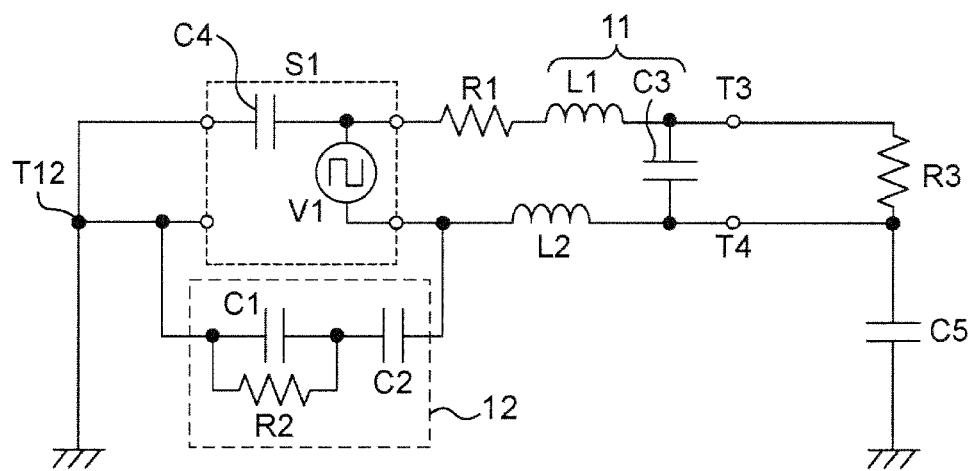
FIG. 7C is a circuit diagram shown in FIGS. 4 and 5 according to Embodiment 1, showing a circuit used in a circuit simulation.

Next, the inventors quantitatively demonstrate the effect of reducing the common mode noise by circuit simulations. The circuit diagrams used in the simulation are shown in FIGS. 7A to 7C. In this case, FIG. 7A shows a circuit diagram without noise suppression. FIG. 7B is a circuit diagram when the ground on the signal input side and the ground on the signal output side are connected by a capacitor as in the conventional case. FIG. 7C is a circuit diagram of the present disclosure. It is assumed that the circuit between external terminals T3 and T4 is terminated with resistor R3, and the ground on the signal output side has a floating capacitance C5 between the same ground and the reference ground of the entire circuit device.

The noise voltage source V1 has a low voltage of 0 V and a high voltage of 5 V, and generates a square wave with a frequency of 750 kHz, and 0% to 100% rise and fall time of 2.5 ns. The values of the circuit elements common to FIG. 7A to FIG. 7C are shown in Table 1 below. In the simulation of FIG. 7B, the capacitance value of capacitor C1 was simulated in two ways with 200 pF and 10 nF. In the simulation of FIG. 7C, the capacitance value of capacitor C1 was set to 200 pF, and the capacitance value of capacitor C2 was set to 10 nF.

TABLE 1

R1 = 50 Ω
R3 = 10 kΩ

TABLE 1-continued

L1 = 100 nH
L2 = 1 nH
C3 = 1 nF
C4 = 2 pF
C5 = 5 pF

FIGS. 8A to 8D are graphs each showing frequency characteristics of the common mode current obtained from the aforementioned simulation. In this case, since the common mode current propagating from the external terminals T3 and T4 (namely, the current flowing through the capacitor C5) becomes the cause of radiation noise, the current spectrum obtained by FFT of this current waveform is plotted.

Figure 8A:
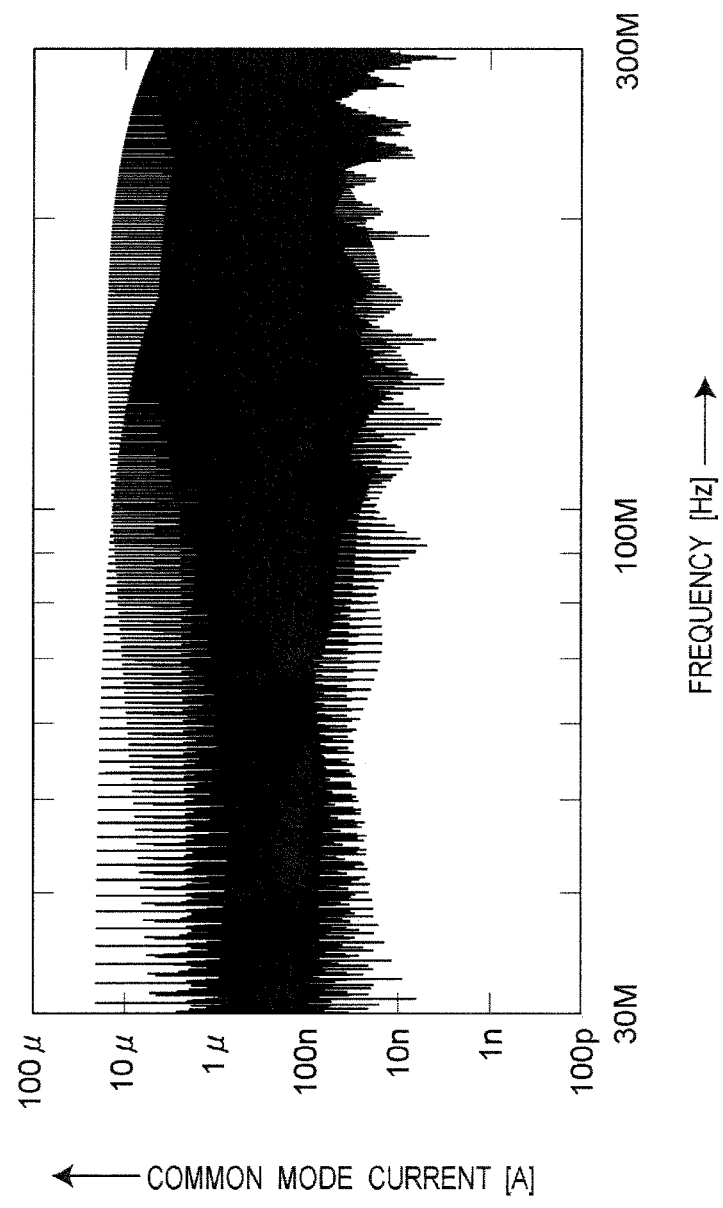
FIG. 8A shows results of the circuit simulation of FIG. 7A, showing a graph of frequency characteristics of a common mode current.

In this case, FIG. 8A shows simulation results of FIG. 7A. As can be seen from FIG. 8A, the common mode current is the largest.

FIG. 8B shows the simulation results of FIG. 7B, where the capacitance value of capacitor C1 is 200 pF. As is apparent from FIG. 8B, it can be confirmed that the common mode current is suppressed as compared to the case without noise suppression.

Figure 8C:
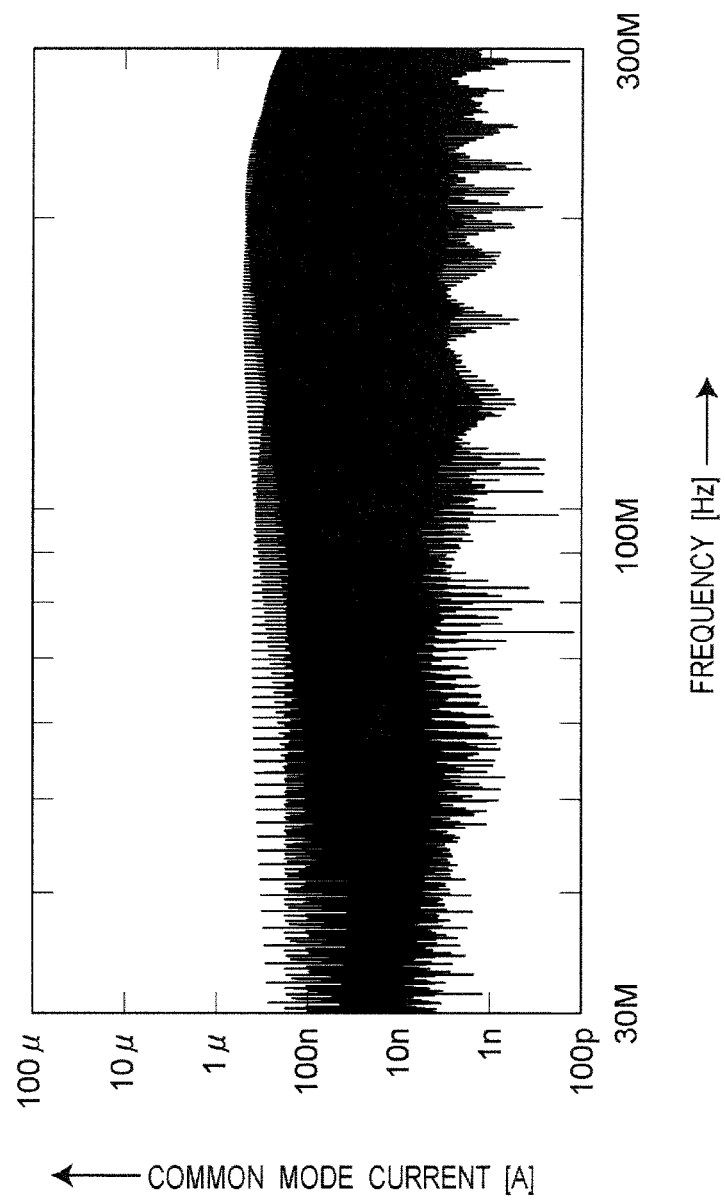
FIG. 8C shows results of the circuit simulation when a capacitance value of a capacitor C1 is increased to 10 nF in the circuit simulation of FIG. 7B, showing a graph of frequency characteristics of the common mode current.

FIG. 8C shows simulation results when the capacitance value of capacitor C1 is increased to 10 nF in the circuit simulation of FIG. 7B. As can be seen from FIG. 8C, the noise suppression effect is not much improved as compared to FIG. 8B.

Figure 8D:
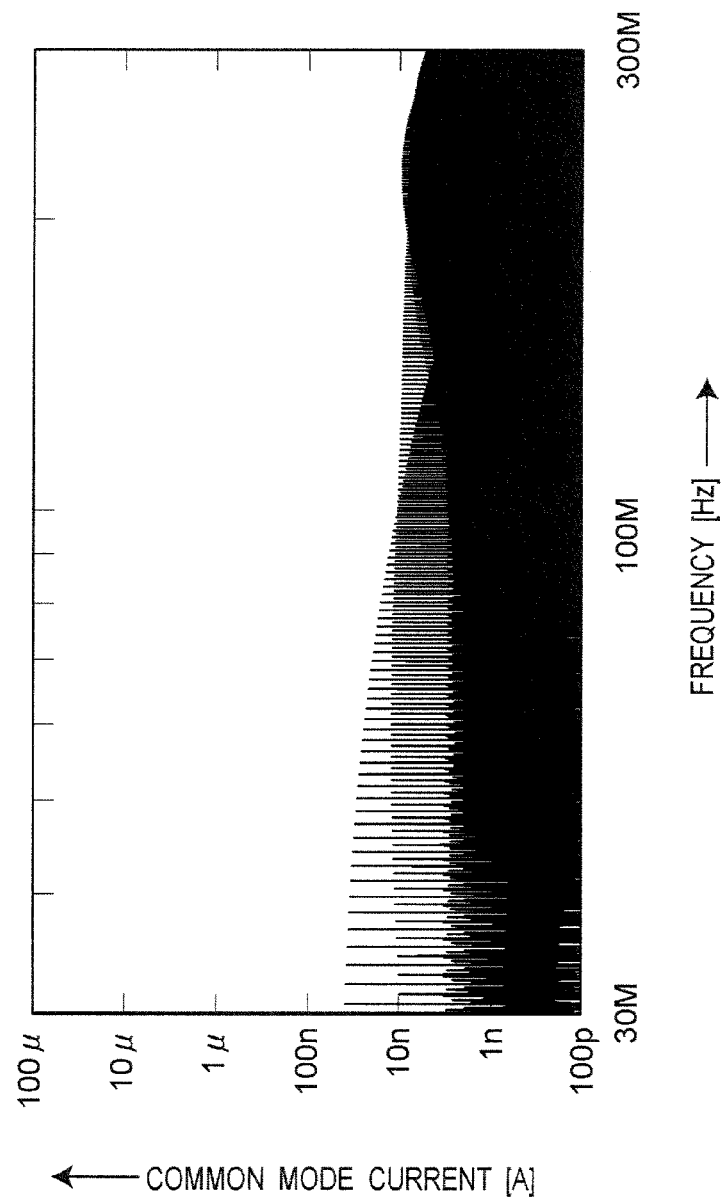
FIG. 8D shows results of the circuit simulation, showing a graph of frequency characteristics of the common mode current in the circuit simulation of FIG. 7C.

FIG. 8D shows the simulation results of FIG. 7C. As is apparent from FIG. 8D, the common mode current is further suppressed, as compared to the case where the signal input side ground and the signal output side ground are connected by a capacitor as in the conventional case. For example, the common mode current at 100 MHz is 290 nA in FIG. 8C, while it is 8.5 nA in FIG. 8D. This means that the energy contributed to the radiated noise has been reduced to (8.5/290)²=0.086%.

As explained above, the capacitive coupling circuit device of the present embodiment can reduce conducted noise and radiated noise, as compared to the conventional configuration in which the signal input side ground and the signal output side ground are connected by the capacitor due to the noise suppression effect described above. This reduces the number of noise-suppressing components to be inserted on the signal line, and this leads to reduction in the component mounting area and cost and improving signal quality.

It is noted that choke coils and ferrite beads can be used as inductors L1 and L2. Either one or both of the inductors L1 and L2 may be parasitic inductance of the signal wiring.

For example, some capacitive coupling isolator circuits have an output impedance of about 50Ω, for example. In such a case, the resistor R1 is considered to be included inside the capacitive coupling circuit S1, and there is no need to use a separate resistor element. Alternatively, the output impedance of the capacitive coupling circuit S1 and the resistor R1 can be used together. In this case, the total value of the output impedance of the capacitive coupling circuit S1 and the resistance R1 is used for the resistance R1 for the equation (1).

Embodiment 2

Figure 9:
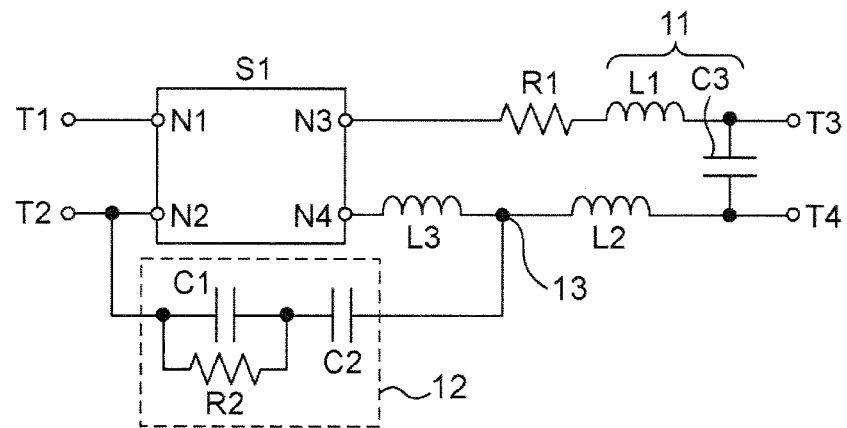
FIG. 9 is a circuit diagram showing a configuration example of a capacitive coupling circuit device according to Embodiment 2.

FIG. 9 is a circuit diagram showing a configuration example of a capacitive coupling circuit device according to Embodiment 2. Referring to FIG. 9, the capacitive coupling circuit device of Embodiment 2 includes an inductor L3 connected to the connection terminal N4, as compared to the capacitive coupling circuit device of FIG. 1.

Referring to FIG. 9, the connection terminal N4 of the capacitive coupling circuit S1 is connected to the external terminal T4 through the inductors L3 and L2. In addition, the connection point of the inductors L3 and L2 is connected to the connection terminal N2 and the external terminal T2 via the ground-side feedback circuit 12.

The capacitive coupling circuit device of FIG. 9 configured as described above operates in the same way as the capacitive coupling circuit device of FIG. 1, for example, as a communication circuit that outputs a signal inputted between the external terminals T1 and T2 to the external terminals T3 and T4.

Figure 10:
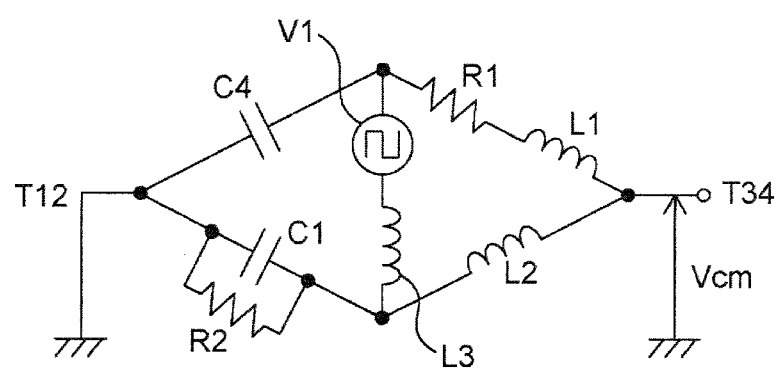
FIG. 10 is a circuit diagram showing an equivalent circuit of FIG. 9 in the case of C1<<C2.

FIG. 10 is a circuit diagram showing a common mode equivalent circuit of FIG. 9 in the case where the capacitance value of capacitor C2 is designed to be sufficiently larger than that of capacitor C1 (C2>>C1), as in Embodiment 1. In this case, when the sum of the noise voltage source V1 and the voltage VL3 across the terminals of inductor L3 is once again defined as an equivalent noise voltage source V2 (=V1+VL3), the voltage transfer coefficient Vcm/V2 from the equivalent noise voltage source V2 to the common mode electrical potential Vcm is equal to the right hand side of the equation (1). In other words, as in the case of Embodiment 1, conducted noise and radiated noise can be reduced, as compared to the configuration of the conventional example in which the ground on the signal input side and the ground on the signal output side are connected by the capacitor. This reduces the number of noise-reducing components to be inserted on the signal line, reduces the component mounting area and the cost, and improves the signal quality.

In Embodiment 2, the inductor L3 connected to the connection terminal N4 is provided as compared to the capacitive coupling circuit device of FIG. 1. However, the present disclosure is not limited to this, and further inductors or ferrite beads may be added to the connection terminal N4, regardless of the element value. Similarly, not only inductors, but also resistors, capacitors, or a combination of these impedances may be used.

Modified Embodiments

Figure 11:
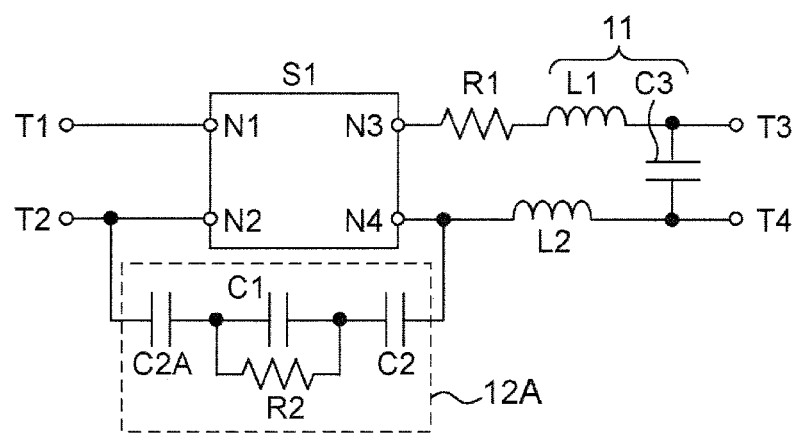
FIG. 11 is a circuit diagram showing an example of a capacitive coupling circuit device according to a modified embodiment.

FIG. 11 is a circuit diagram showing a configuration example of a capacitive coupling circuit device according to a modified embodiment. Referring to FIG. 11, the capacitive coupling circuit device according to the modified embodiment is characterized by including a ground-side feedback circuit 12A in place of the ground-side feedback circuit 12, as compared to the capacitive coupling circuit device of FIG. 1.

Referring to FIG. 11, the ground-side feedback circuit 12A is configured by connecting capacitors C2 and C2A in series to both ends of the parallel circuit of the resistor R2 and the capacitor C1, respectively. In the ground-side feedback circuit 12A, the series circuit of at least three capacitors C2, C1, and C2A is inserted between the respective connection terminals N4 and N2, and the resistor R2 is connected in parallel to capacitor C1. Therefore, the electrical insulation between the signal input side and the signal output side can be prevented from being damaged.

The capacitive coupling circuit device according to the present disclosure is useful for realizing low-noise, compact, and low-cost signal circuit devices used in automotive equipment, industrial equipment, medical equipment, and the like, and for improving the signal quality.

The invention claimed is:

1. A capacitive coupling circuit device comprising:
a capacitive coupling circuit that demodulates a modulated signal, which is obtained by modulating an input signal and transmitting a modulated input signal through a coupling capacitor; and
a ground-side feedback circuit inserted between a first ground terminal on a signal input side of the capacitive coupling circuit, and a second ground terminal on a signal output side,
wherein the ground-side feedback circuit is configured by connecting a second capacitor in series to a parallel circuit of a first capacitor and a first resistor.

2. The capacitive coupling circuit device as claimed in claim 1, further comprising a third capacitor connected such that the ground-side feedback circuit is configured by connecting the second capacitor and the third capacitor in series to both ends of the parallel circuit of the first capacitor and the first resistor, respectively.

3. The capacitive coupling circuit device as claimed in claim 1, further comprising:
a first inductor inserted between a signal output terminal of the capacitive coupling circuit, and a signal output external terminal of the capacitive coupling circuit device; and
a second inductor inserted between the second ground terminal on the signal output side of the capacitive coupling circuit and a ground external terminal on the signal output side of the capacitive coupling circuit device, and
wherein a ratio of a capacitance value of the coupling capacitor to a capacitance value of the first capacitor is equal to a ratio of an inductance value of the second inductor to an inductance value of the first inductor.

4. The capacitive coupling circuit device as claimed in claim 3, further comprising:
a second resistor, which is inserted between the signal output terminal of the capacitive coupling circuit and one end of the first inductor,
wherein a ratio of the capacitance value of the coupling capacitor to an inverse of a resistance value of the first resistor is equal to a ratio of an inductance value of the second inductor to a resistance value of the second resistor.

5. The capacitive coupling circuit device as claimed in claim 4,
wherein the second resistor is an output resistor of the capacitive coupling circuit.

6. The capacitive coupling circuit device as claimed in claim 3,
wherein at least one of the first and second inductors is a parasitic inductance of a signal wiring.

7. The capacitive coupling circuit device as claimed in claim 3, further comprising:
a third inductor, which is inserted between the second ground terminal on the signal output side of the capacitive coupling circuit, and a connection point of one end of the second inductor and one end of the ground-side feedback circuit.

8. The capacitive coupling circuit device as claimed in claim 1,
wherein the capacitive coupling circuit is an isolator circuit of capacitive coupling type.

* * * * *